United States Patent
Choi et al.

(10) Patent No.: US 8,006,162 B2
(45) Date of Patent: *Aug. 23, 2011

(54) METHOD FOR PADDING AND PUNCTURING LOW DENSITY PARITY CHECK CODE

(75) Inventors: Eoi-Young Choi, Seoul (KR); Seung-Bum Suh, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1116 days.

This patent is subject to a terminal disclaimer.

(21) Appl. No.: 11/435,014

(22) Filed: May 16, 2006

(65) Prior Publication Data
US 2007/0011567 A1   Jan. 11, 2007

(30) Foreign Application Priority Data
May 16, 2005   (KR) .................. 10-2005-0040720

(51) Int. Cl.
*H03M 13/00* (2006.01)
(52) U.S. Cl. ......................... 714/758; 714/790
(58) Field of Classification Search .................. 714/758, 714/790
See application file for complete search history.

(56) References Cited

U.S. PATENT DOCUMENTS

| | | | | |
|---|---|---|---|---|
| 6,633,856 B2 * | 10/2003 | Richardson et al. | ............ | 706/15 |
| 6,789,227 B2 * | 9/2004 | De Souza et al. | ............. | 714/804 |
| 6,895,547 B2 * | 5/2005 | Eleftheriou et al. | ......... | 714/801 |
| 6,938,196 B2 * | 8/2005 | Richardson et al. | .......... | 714/752 |
| 7,421,644 B2 * | 9/2008 | Mantha et al. | ................ | 714/800 |
| 7,620,880 B2 * | 11/2009 | Niu et al. | ...................... | 714/790 |
| 2002/0051501 A1 * | 5/2002 | Demjanenko et al. | ........ | 375/298 |
| 2003/0023917 A1 * | 1/2003 | Richardson et al. | .......... | 714/749 |
| 2005/0149841 A1 * | 7/2005 | Kyung et al. | ................. | 714/800 |
| 2005/0257124 A1 * | 11/2005 | Richardson et al. | .......... | 714/796 |
| 2008/0282127 A1 * | 11/2008 | Mantha et al. | ................ | 714/751 |
| 2009/0259915 A1 * | 10/2009 | Livshitz et al. | ............... | 714/758 |

FOREIGN PATENT DOCUMENTS
EP            1 653 629          5/2006

OTHER PUBLICATIONS

Jeong-Seok Ha et al., Optimal Puncturing of Irregular Low-Density Parity-Check Codes, 2003.
Mohammadreza Yazdani et al., On Construction of Rate-Compatible Low-Density Parity-Check Codes, 2004.
Dinoi et al., Design of Variable-Rate Irregular LDPC Codes with Low Error Floor, 2005.

* cited by examiner

*Primary Examiner* — M. Mujtaba K Chaudry
(74) *Attorney, Agent, or Firm* — NSIP Law

(57) ABSTRACT

Disclosed is a method for puncturing a Low Density Parity Check (LDPC) code that is expressed by a factor graph having a check node and a variable node, connected to each other by an edge, and is decoded by a parity check matrix including a parity part having a single weight-3 column and a dual-diagonal matrix. The method includes selecting 1-step recoverable (1-SR) variable nodes with the highest quality including a variable node mapped to a weight-3 column, and setting a first puncturing priority group using the selected 1-SR variable nodes, selecting k-step recoverable (k-SR) variable nodes with the highest quality in the next step k taking into account the variable nodes selected in the current step, and setting a priority group for each individual step, puncturing an LDPC code mapped to a variable node belonging to a corresponding group according to priority of each group obtained in the preceding steps.

15 Claims, 9 Drawing Sheets

○ : 1-SR VARIABLE NODE
◎ : 2-SR VARIABLE NODE
● : UNPUNCTURED BIT NODE
+ : CHECK NODE

FIG.1

| | N-0 | N-1 | N-2 | N-3 | N-4 | N-5 | N-6 | N-7 | N-8 | N-9 | N-10 | N-11 | N-12 | N-13 | N-14 | N-15 | N-16 | N-17 | N-18 | N-19 | N-20 | N-21 | N-22 | N-23 |
|---|---|---|---|---|---|---|---|---|---|---|---|---|---|---|---|---|---|---|---|---|---|---|---|---|
| | 0 | -1 | -1 | 0 | -1 | 0 | -1 | -1 | 0 | -1 | -1 | -1 | 0 | -1 | -1 | -1 | -1 | -1 | -1 | -1 | -1 | -1 | -1 | -1 |
| | 29 | -1 | 0 | 26 | -1 | -1 | 0 | -1 | 0 | -1 | -1 | -1 | -1 | 0 | -1 | -1 | -1 | -1 | -1 | -1 | -1 | -1 | -1 | -1 |
| | -1 | -1 | -1 | 21 | 0 | -1 | 17 | -1 | -1 | 38 | -1 | 0 | -1 | 0 | 0 | -1 | -1 | -1 | -1 | -1 | -1 | -1 | -1 | -1 |
| | 43 | -1 | -1 | 30 | -1 | -1 | -1 | 0 | -1 | 41 | 0 | -1 | -1 | -1 | 0 | 0 | -1 | -1 | -1 | -1 | -1 | -1 | -1 | -1 |
| | 5 | -1 | -1 | -1 | 20 | 20 | 35 | -1 | -1 | 2 | -1 | -1 | 0 | -1 | -1 | 0 | 0 | -1 | -1 | -1 | -1 | -1 | -1 | -1 |
| | -1 | 46 | -1 | -1 | -1 | -1 | 22 | -1 | -1 | 8 | -1 | -1 | -1 | -1 | -1 | -1 | 0 | 0 | -1 | -1 | -1 | -1 | -1 | -1 |
| | -1 | -1 | -1 | 9 | -1 | -1 | 18 | 13 | 40 | -1 | -1 | 0 | -1 | -1 | -1 | -1 | -1 | 0 | 0 | -1 | -1 | -1 | -1 | -1 |
| | 2 | -1 | 44 | -1 | -1 | -1 | 27 | -1 | -1 | 35 | -1 | -1 | -1 | -1 | -1 | -1 | -1 | -1 | 0 | 0 | -1 | -1 | -1 | -1 |
| | 33 | -1 | -1 | 29 | -1 | -1 | 16 | -1 | -1 | 25 | 18 | -1 | -1 | -1 | -1 | -1 | -1 | -1 | -1 | 0 | 0 | -1 | -1 | -1 |
| | -1 | 35 | -1 | 4 | -1 | 14 | -1 | -1 | 15 | -1 | -1 | 27 | -1 | -1 | -1 | -1 | -1 | -1 | -1 | -1 | 0 | 0 | -1 | -1 |
| | 5 | -1 | -1 | 19 | -1 | -1 | -1 | -1 | -1 | 17 | 11 | -1 | -1 | -1 | -1 | -1 | -1 | -1 | -1 | -1 | -1 | 0 | 0 | -1 |
| | 10 | -1 | -1 | -1 | 21 | -1 | 18 | 8 | -1 | -1 | -1 | 30 | -1 | -1 | -1 | -1 | -1 | -1 | -1 | -1 | -1 | -1 | 0 | 0 |

FIG.2

|  | N-12 | N-13 | N-14 | N-15 | N-16 | N-17 | N-18 | N-19 | N-20 | N-21 | N-22 | N-23 |
|---|---|---|---|---|---|---|---|---|---|---|---|---|
|  | 1 | 0 | -1 | -1 | -1 | -1 | -1 | -1 | -1 | -1 | -1 | -1 |
|  | -1 | 0 | 0 | -1 | -1 | -1 | -1 | -1 | -1 | -1 | -1 | -1 |
|  | -1 | -1 | 0 | 0 | -1 | -1 | -1 | -1 | -1 | -1 | -1 | -1 |
|  | -1 | -1 | -1 | 0 | 0 | -1 | -1 | -1 | -1 | -1 | -1 | -1 |
|  | -1 | -1 | -1 | -1 | 0 | 0 | -1 | -1 | -1 | -1 | -1 | -1 |
|  | 0 | -1 | -1 | -1 | -1 | 0 | 0 | -1 | -1 | -1 | -1 | -1 |
|  | -1 | -1 | -1 | -1 | -1 | -1 | 0 | 0 | -1 | -1 | -1 | -1 |
|  | -1 | -1 | -1 | -1 | -1 | -1 | -1 | 0 | 0 | -1 | -1 | -1 |
|  | -1 | -1 | -1 | -1 | -1 | -1 | -1 | -1 | 0 | 0 | -1 | -1 |
|  | -1 | -1 | -1 | -1 | -1 | -1 | -1 | -1 | -1 | 0 | 0 | -1 |
|  | -1 | -1 | -1 | -1 | -1 | -1 | -1 | -1 | -1 | -1 | 0 | 0 |
|  | 1 | -1 | -1 | -1 | -1 | -1 | -1 | -1 | -1 | -1 | -1 | 0 |
|  | 3 | 2 | 2 | 2 | 2 | 2 | 2 | 2 | 2 | 2 | 2 | 2 |

FIG.3

| N-12 | N-13 | N-14 | N-15 | N-16 | N-17 | N-18 | N-19 | N-20 | N-21 | N-22 | N-23 |
|---|---|---|---|---|---|---|---|---|---|---|---|
| 1 | 0 | -1 | -1 | -1 | -1 | -1 | -1 | -1 | -1 | -1 | -1 |
| -1 | 0 | 0 | -1 | -1 | -1 | -1 | -1 | -1 | -1 | -1 | -1 |
| -1 | -1 | 0 | 0 | -1 | -1 | -1 | -1 | -1 | -1 | -1 | -1 |
| -1 | -1 | -1 | 0 | 0 | -1 | -1 | -1 | -1 | -1 | -1 | -1 |
| -1 | -1 | -1 | -1 | 0 | 0 | -1 | -1 | -1 | -1 | -1 | -1 |
| 0 | -1 | -1 | -1 | -1 | 0 | 0 | -1 | -1 | -1 | -1 | -1 |
| -1 | -1 | -1 | -1 | -1 | -1 | 0 | 0 | -1 | -1 | -1 | -1 |
| -1 | -1 | -1 | -1 | -1 | -1 | -1 | 0 | 0 | -1 | -1 | -1 |
| -1 | -1 | -1 | -1 | -1 | -1 | -1 | -1 | 0 | 0 | -1 | -1 |
| -1 | -1 | -1 | -1 | -1 | -1 | -1 | -1 | -1 | 0 | 0 | -1 |
| -1 | -1 | -1 | -1 | -1 | -1 | -1 | -1 | -1 | -1 | 0 | 0 |
| 1 | -1 | -1 | -1 | -1 | -1 | -1 | -1 | -1 | -1 | -1 | 0 |

Groups: $G_{1-1}$, $G_{2-1}$, $G_{1-2}$, $G_{1-3}$, $G_{2-2}$, $G_{1-4}$, $G_{1-5}$, $G_{2-3}$, $G_{1-6}$

FIG.5

| N-1 | N-2 | N-3 | N-4 | N-5 | N-6 | N-7 | N-8 | N-9 | N-10 | N-11 | N-12 |
|---|---|---|---|---|---|---|---|---|---|---|---|
| 0 | 0 | -1 | 0 | -1 | 0 | -1 | -1 | -1 | 0 | -1 | -1 |
| 29 | -1 | 0 | 26 | -1 | -1 | 0 | -1 | 0 | -1 | -1 | -1 |
| -1 | -1 | -1 | 21 | 0 | -1 | 17 | -1 | -1 | 38 | -1 | 0 |
| 43 | -1 | -1 | 30 | -1 | -1 | -1 | 0 | -1 | 41 | 0 | -1 |
| 5 | -1 | 1 | -1 | -1 | 20 | 35 | -1 | -1 | 2 | -1 | -1 |
| -1 | 46 | -1 | -1 | -1 | -1 | 22 | -1 | 40 | 8 | -1 | -1 |
| -1 | -1 | -1 | 9 | -1 | -1 | 18 | 13 | -1 | 35 | -1 | 27 |
| 2 | -1 | 44 | -1 | -1 | -1 | 27 | -1 | -1 | 25 | 18 | -1 |
| 33 | 35 | -1 | 29 | -1 | -1 | 16 | -1 | -1 | -1 | -1 | 30 |
| -1 | -1 | -1 | 4 | 4 | -1 | -1 | -1 | 15 | 17 | -1 | -1 |
| 5 | -1 | -1 | 19 | -1 | 14 | -1 | -1 | -1 | -1 | 11 | -1 |
| 10 | -1 | -1 | -1 | 21 | -1 | 18 | 8 | -1 | -1 | -1 | -1 |
| 8 | 3 | 3 | 8 | 3 | 3 | 8 | 3 | 3 | 8 | 3 | 3 |

FIG.7

METHOD FOR PADDING AND PUNCTURING LOW DENSITY PARITY CHECK CODE

PRIORITY

This application claims the priority under 35 U.S.C. §119 (a) to an application entitled "Method for Padding and Puncturing Low Density Parity Check Code" filed in the Korean Intellectual Property Office on May 16, 2005 and assigned Serial No. 2005-40720, the contents of which are incorporated herein by reference.

BACKGROUND OF THE INVENTION

1. Field of the Invention

The present invention relates generally to a Low Density Parity Check, (LDPC) code, and in particular, to an LDPC code padding and puncturing method for defining regularities of puncturing and padding priorities for a parity part to be punctured and a systematic part to be padded and performing padding and puncturing by the bit or by the block accordingly thereto, thereby decreasing the structural complexity and improving performance at the required code rate.

2. Description of the Related Art

Recently, in the wireless communication field, an increasing need for various types of multimedia data has caused a rapidly increasing demand for a higher data rate and a broader service area. Thus, wireless Local Area Networks (LANs) and/or wireless Metropolitan Area Networks (MANs) have attracted great attention as technologies to fulfill the need for high-speed data transmission. Many related companies are making efforts to establish a further improved standard in alliance with each other.

Digital wireless communication schemes covering the wireless LAN field or the wireless MAN field use various types of error correction schemes to effectively remove and/or correct errors caused by various factors such as noise, distortion, and interference caused by data transmission. These error correction schemes can use convolutional codes or turbo codes. However, because of their functional and technical limitations, these schemes are difficult to apply to systems providing stable high-speed data communication required by new standards. Therefore, conventional coding is rapidly being replaced by an alternative coding that is based on LDPC codes having higher performance, lower decoding complexity, and higher decoding rate by parallel processing.

The LDPC code is defined as a parity check matrix H in which the number of '1's in each row and column is less than the number of '0's, and is used for determining whether decoding for a received signal was normally achieved. That is, if the product of a coded received signal and the parity check matrix is '0', it is determined that there is no received error. Therefore, for the LDPC code, it is possible to first design a predetermined parity check matrix, whose product for every coded received signal can be '0', and then inversely calculate a coding matrix G for coding a transmission signal according to the determined parity check matrix, or it is possible to directly calculate parities to be included in codewords a parity check matrix H according to various recently proposed calculation methods.

It will be assumed herein that the LDPC code is applied to the wireless LAN field.

In the wireless LAN field, an IEEE 802.11a/g-based system, whose maximum data rate of 54 Mbps which is greater than a data rate of 11 Mbps of the current IEEE 802.11b-based system, is commercially appearing. Moreover, a standard for a data rate and an improved quality-of-service (QoS) is being developed under the IEEE 802.11 standard.

Recently, wireless communication service providers have begun to provide high-speed wireless Internet service in "hotspot zones" using wireless LAN technologies. Moreover, even in the home network systems, wireless LAN technologies are appraised as one of the core technologies capable of interworking with the high-speed wired Internet access systems such as the xDSL or the cable modems. Accordingly, these technologies are considered capable of inexpensively realizing broadband wireless data service by interworking with systems which can support broad service areas, such as conventional cellular systems.

Recently, active standardization work for guaranteeing high data rates, improved QoS, and supporting mobility is being undertaken by a Task Group (TG) in IEEE 802.11. More particularly, a standard for the next generation wireless LAN has been established in early 2002 by Task Group N (TGn) in IEEE 802.11. The standard set forth by the TGn aims not only at increasing a data rate in a physical (PHY) layer but also at increasing transmission efficiency in an upper layer.

There are also two working groups known as TGn Sync and WwiSE in the TGn, and several companies jointly developing standards under these working groups.

A brief description will now be made of the details proposed in the TGn Sync working group (hereinafter TGn Sync). The TGn Sync is being defined to support a data rate of 243 Mbps in an mandatory mode and a data rate of up to a maximum of 630 Mbps in an optional mode. The TGn Sync adopts SDM technology that uses a maximum of 4 transmission antennas, and various types of MIMO-OFDM technologies including the beamforming technology based on a Singular Value Decomposition (SVD) scheme to increase performance and capacity. The TGn Sync uses the LDPC code in addition to the conventional convolutional code as a channel code, aiming at supporting a maximum of 630 Mbps in a 40 MHz band. In the proposed standard (i.e., the TGn Sync standard), the use of 20 MHz and 40 MHz bands is included in the mandatory mode, and particularly, a subcarrier allocation method in a frequency domain of a 20 MHz band mode (which is similar to the existing IEEE 11a/g schemes) is provided to maintain compatibility with current IEEE 11a/g schemes. In the 40 MHz band, of a total of 128 sub-channels, 6 sub-channels are allocated to a pilot tone and 106 sub-channels are allocated to the data.

In the foregoing channel coding method defined by the TGn Sync, the LDPC code used for high-speed communication is defined such that it has the following detailed characteristics.

One base matrix is prepared for each of used code rates ½, ⅔, ¾, and ⅚ (or ⅞). Each base matrix having a total of 24 columns is divided into a systematic part and a parity part. The parity part is includes a dual-diagonal matrix (having a structure to which a column weight-3 column is further added).

For packet coding, two types of codewords with N=576 and N=1728 (where N defines a length) are used.

Table 1 below shows a relationship between LDPC code rates R, lengths N of codewords according thereto, and lengths K of systematic information included therein, defined by TGn Sync.

TABLE 1

| Code rate (R) | Codeword length (N) | Information length (K) | Codeword length (N) | Information length (K) |
| --- | --- | --- | --- | --- |
| 1/2 | 1728 | 864 | 576 | 288 |
| 2/3 | 1728 | 1152 | 576 | 384 |
| 3/4 | 1728 | 1296 | 576 | 432 |
| 5/6 | 1728 | 1440 | 576 | 480 |
| 7/8 | 1728 | 1512 | 576 | 504 |

In order to cope with a random packet length using the above LDPC code rates and codeword lengths, the TGn Sync channel coding method defines a concatenation rule using both padding and puncturing schemes, thereby maintaining performance. The padding and puncturing schemes currently applied to the TGn Sync use consecutive patterns such as those defined in Equation 1, below.

$$C^i = \{\underbrace{d_0^i, d_1^i, \ldots, d_{K_1-1}^i, \overbrace{0, 0, \ldots, 0}^{N_{PAD\_CW}}, p_0^i, p_1^i, \ldots, p_{M_1-1}^i, \overbrace{p_{M_1}^i, \ldots, p_{M-1}^i}^{N_{PUNCTURE\_CW}}\}}_{K} \quad (1)$$

In Equation (1), K denotes a length of systematic information, M denotes a length of parity information, NPAD_CW denotes a length to be padded per codeword, and NPUNCTURE_CW denotes a length to be punctured per codeword. That is, it is possible to transmit a variable-length packet at a predetermined code rate according to the above pattern. However, the above simple padding and puncturing scheme considers only the simple hardware realization, and performance verification for the scheme has not been carried out. The simple padding and puncturing scheme experiences differences in performance depending upon padding and puncturing patterns and padding and puncturing lengths which are actually used. In particular, for the puncturing, an increase in puncturing length causes a deterioration in performance.

Although research, which is not aimed at application to the TGn Sync, is being undertaken to determine optimal puncturing patterns for preventing performance deterioration due to the puncturing, currently proposed schemes cannot be applied to actual systems. Moreover, because various proposed puncturing pattern generation schemes are based on infinite codewords, they too cannot be readily applied to actual systems. The puncturing pattern generation schemes can decrease performance by implementing random puncturing or can increase performance by optimizing puncturing priorities according to puncturing length. However, a change in the puncturing length decreases efficiency by requiring the calculation of optimal puncturing order. In addition, because research on padding patterns having inconsiderable performance differences is relatively unsatisfactory, it is difficult to determine coding for which both padding and puncturing necessary for actively transmitting variable-length packets.

SUMMARY OF THE INVENTION

It is, therefore, an object of the present invention to provide an LDPC code padding and puncturing method for determining priority of a column mapped to an LDPC code to be punctured through a simple arithmetic rule for the case where a parity check matrix includes a parity part having a specific structure, and determining priority of a column mapped to an LDPC code to be padded according to a column weight for the case where the parity check matrix has a systematic matrix whose column weight is irregular, thereby to simplify the calculation for obtaining flexibility of the frame size, thus increasing realization facility, reducing a coding delay time, and improving system performance.

According to one aspect of the present invention, there is provided a method for puncturing a Low Density Parity Check (LDPC) code that is expressed by a factor graph having a check node and a variable node connected to each other by an edge, and decoded by a base matrix including a parity part a single weight-3 column and a dual-diagonal matrix. The method includes acquiring preferential puncturing variable nodes including variable node of an LDPC code mapped to the weight-3 column according to an arithmetic rule and performing puncturing on an LDPC code mapped to variable nodes according to priorities of the acquired preferential puncturing variable nodes.

Preferably, the base matrix is a matrix obtained by dividing a parity check matrix for decoding an LDPC code into shifted unit circulant matrix and zero matrix blocks having a predetermined size, and representing each of the blocks as an element thereof.

Preferably, if the variable node is mapped to one block and there is a remainder after bits of an LDPC code to be punctured are divided by the block size, bits corresponding to the remainder are punctured according to each column of a matrix constituting a block mapped to the last variable node of sequentially selected preferential puncturing variable nodes.

Preferably, the step of acquiring preferential puncturing variable nodes includes selecting 1-step recoverable (1-SR) variable nodes with the highest quality including a variable node mapped to the weight-3 column, and designating a group to be first punctured using the selected 1-SR variable nodes, and selecting k-Step Recoverable (k-SR) variable nodes with the highest quality in a next step k taking into account the variable nodes belonging to the group selected in the current step, and designating a group to be punctured next using the selected k-SR variable nodes.

According to another aspect of the present invention, there is provided a method for puncturing a Low Density Parity Check (LDPC) code that is expressed by a factor graph having a check node and a variable node connected to each other by an edge, and is decoded by a parity check matrix including a parity part comprised of a single weight-3 column and a dual-diagonal matrix. The method includes selecting 1-step recoverable (1-SR) variable nodes with the highest quality including a variable node mapped to a weight-3 column, and setting a first puncturing priority group using the selected 1-SR variable nodes, selecting k-step recoverable (k-SR) variable nodes with the highest quality in the next step k taking into account the variable nodes selected in the current step, and setting a priority group for each individual step puncturing an LDPC code mapped to a variable node belonging to a corresponding group according to priority of each group obtained in the preceding steps.

Preferably, the priority group is selected such that a total number of survived check nodes connected to the variable nodes in the group is maximized.

According to yet another aspect of the present invention, there is provided a method for padding and puncturing a Low Density Parity Check (LDPC) code that is expressed by a factor graph having a check node and a variable node connected to each other by an edge, and is decoded by a base matrix having a parity part having a single weight-3 column and a dual-diagonal matrix, and a systematic part including matrixes with different column weights. The method including performing padding on an LDPC code mapped to a corresponding column in order of a low column weight among columns of the systematic part, and performing puncturing on an LDPC code mapped to columns of a parity part independently obtained for each individual puncturing priority level according to an arithmetic iterative selection rule.

BRIEF DESCRIPTION OF THE DRAWINGS

The above and other objects, features and advantages of the present invention will become more apparent from the following detailed description when taken in conjunction with the accompanying drawings in which:

FIG. 1 is a block diagram illustrating a parity part structure of a parity check matrix to which the present invention is applicable;

FIG. 2 is a diagram illustrating an exemplary base matrix used for an LDPC code;

FIG. 3 is a diagram illustrating a parity part of the base matrix shown in FIG. 2, and a column weight of each column;

FIG. 5 is a diagram illustrating a puncturing priority group of the parity part shown in FIG. 2;

FIG. 7 is a diagram illustrating a systematic part of the base matrix shown in FIG. 2, and weights of the columns constituting the systematic part;

DETAILED DESCRIPTION OF EXEMPLARY EMBODIMENTS

Exemplary embodiments of the present invention will now be described in detail with reference to the annexed drawings. In the following description, a detailed description of known functions and configurations incorporated herein has been omitted for clarity and conciseness.

Figure 1:
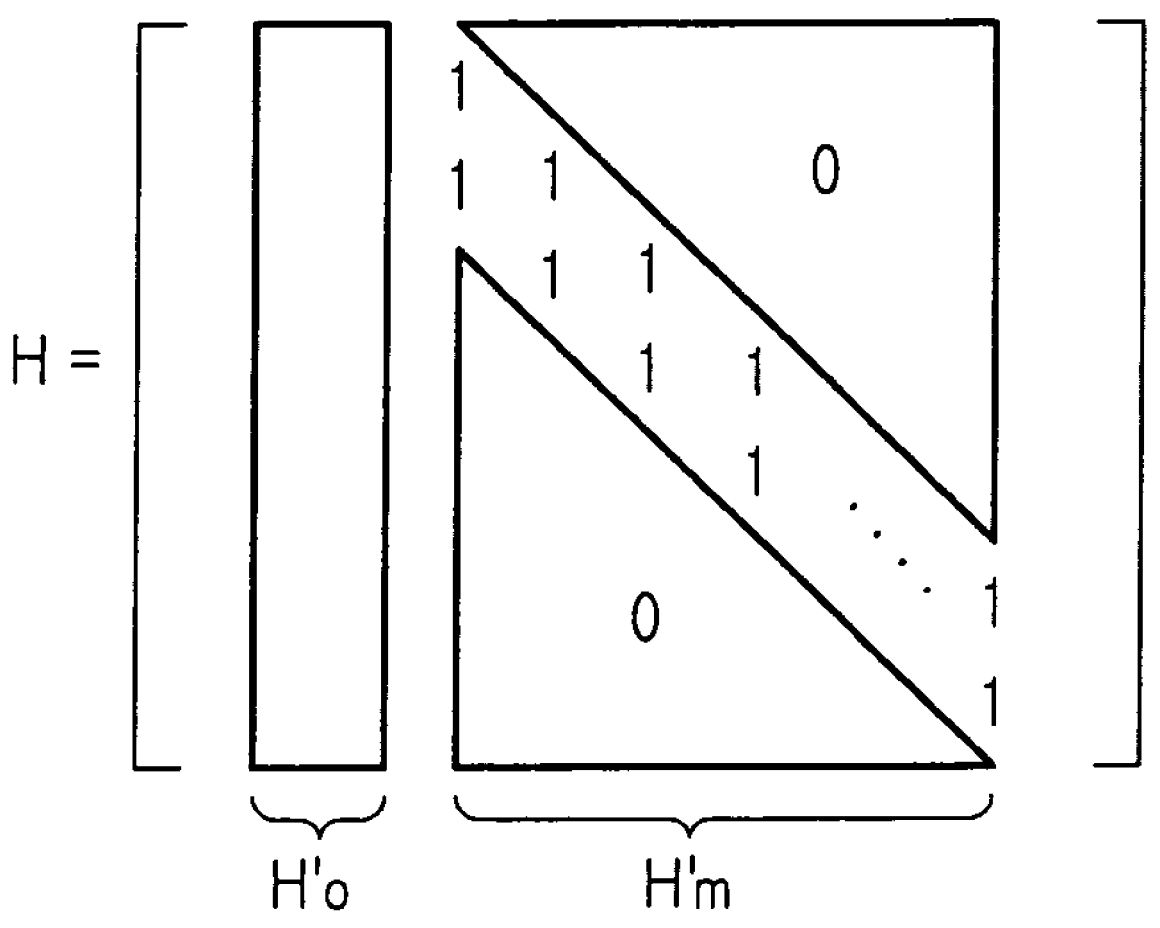

FIG. 1 is a diagram illustrating a parity part structure of a parity check matrix to which the present invention is applicable. With reference to FIG. 1, a dual-diagonal matrix structure with single weight-3 column, having a column weight-2 dual-diagonal matrix H'm and a column weight-3 column H'o located in front thereof, and a parity part with an extended structure of the matrix is shown.

The use of the parity check matrix including the parity part with the above structure decreases the coding complexity and facilitates the hardware structure LDPC code defined by a parity check matrix including a parity part as shown in FIG. 1 can be used by conventional standards with this structure is attracting much attention. For example, the TGn Sync for IEEE 802.11n, and IEEE 802.16e preparing for a new standard related to wireless MAN each adopt the LDPC code defined by the parity check matrix (such as is shown in FIG. 1) Additionally, it is expected that more wireless data communication schemes will use the LDPC code defined as a parity check matrix having a structure such as that shown in FIG. 1.

FIG. 2 is a diagram illustrating a code rate R=0.5 base matrix Hb adopted for TGn Sync. In the illustrated case, a general parity check matrix H is divided into z×z unit circulant matrixes and z×z zero (0) matrixes, each of them is regarded as one block, the z×z 0 matrixes are represented by −1, and the other numbers are represented by the number of right-shifting the z×z unit circulant matrixes. It can be noted that the right parity part is distinguished by a dotted line, and the parity part structure includes a weight-3 column and a weight-2 dual-diagonal matrix. If the parity check matrix H is defined by the block in this way, function analysis and calculation is simple and has regularity, facilitating actual implementation.

Because each of the blocks, which are the items constituting the parity part having the above structure, includes z×z unit circulant matrixes and 0 matrixes, when a parity part of a parity check matrix H that expressed the blocks by the bit is represented by a factor graph, it is equivalent to repeating, z times, a parity part of the base matrix Hb represented by the factor graph. Therefore, a puncturing or padding method for the parity part of the general bit-based parity check matrix H can be intactly applied to the parity part of the base matrix Hb includes a unit circulant matrix block and a 0 matrix block, and vice versa.

FIG. 3 is a diagram illustrating a parity part of the base matrix shown in FIG. 2, and a column weight of each column. As illustrated, a weight of the leftmost column is highest to 3, and weights of the other columns are all equal to 2.

Figure 4:
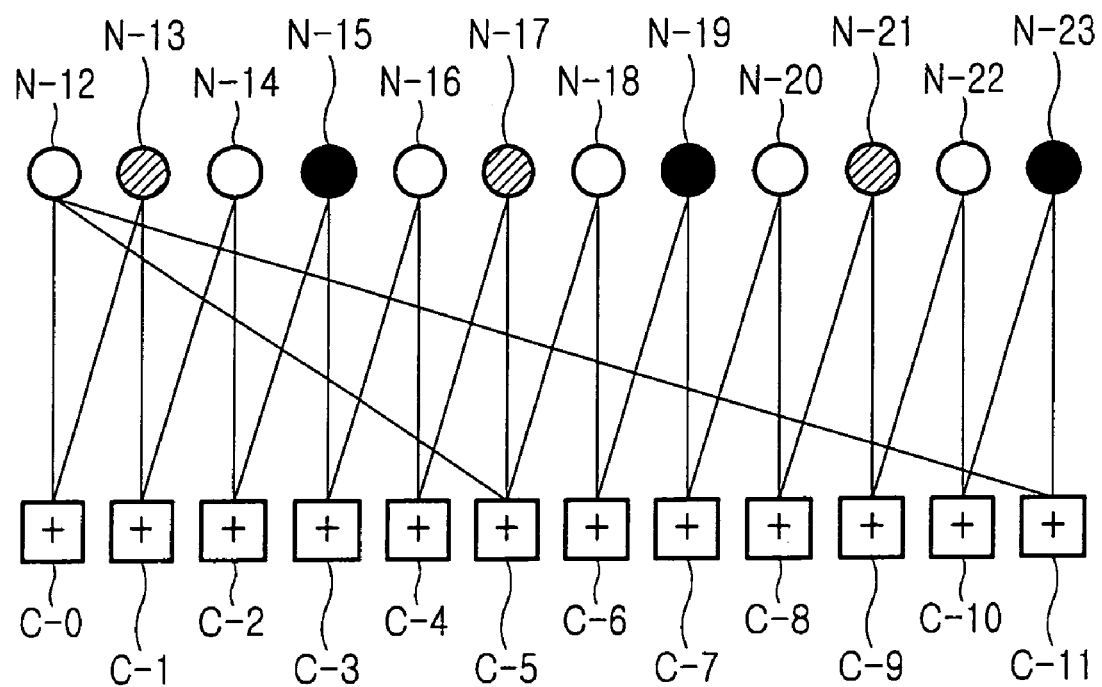
FIG. 4 is a diagram illustrating a factor graph of the parity party shown in FIG. 3, wherein the parity part is punctured according to the present invention.

These are expressed by a factor graph in FIG. 4. In the factor graph, each of variable nodes N12 to N23 is a z×z unit circulant matrix or a 0 matrix. If these are actually shown bit by bit, it can be expressed that there are z graphs identical to the illustrated graph in parallel, and if a structure of the bit-based parity check matrix H is equal to the structure of FIG. 1, it is expressed by the factor graph with the same structure.

That is, the factor graph for the parity part with the structure of FIG. 1 has a zigzag structure (factor graph of a dual-diagonal matrix) shown in FIG. 4, and only the connection part of a variable node mapped to a column weight-3 column varies according to matrix structure. This is the appropriate structure to which a criterion for finding a puncturing pattern according to the present invention can be applied.

Before continuing, several terminologies will be defined in order to give a description of the present invention. A puncturing variable node recoverable in a specific iterative decoding step in a puncturing process is referred to as a k-Step Recoverable (k-SR) node, and if a punctured variable node is adjacent (connected) to more than one check nodes C-0 to C-11 connected to at least one (k−1)-SR node and m-SR nodes (for, $0 \leq m \leq k-1$), the punctured bit nodes are referred to as k-Step Recoverable (k-SR) nodes. The check nodes satisfying the above criterion are referred to as Survived Check (SC) nodes.

A description will now be made of the generalized k-SR, by way of example. 1-SR, when it is punctured, means variable nodes N-12, N-14, N-16, N-18, N-20, and N-22 recoverable through 1-step iterative decoding. As to the node N-14 among the variable nodes, because connected check nodes include C-1 and C-2, and the variable nodes connected at this time include only the unpunctured (0-SR) nodes N-13 and N-15 except for the node N-14 itself, the check nodes C-1 and C-2 become survived nodes, and the variable node N-14 becomes a 1-SR node. In the illustrated case, G1={N-12, N-14, N-16, N-18, N-20, N-22} is selected as a 1-SR node group, and because variable nodes N-12, N-14, N-16, N-20 and N-22 each have 2 SCs and the variable node N-18 has one SC, the 1-SR group has a total of 11 SCs. However, the 1-SR node group can be selected by a designer. For example, G1'={N-12, N-13, N-15, N-16, N-18, N-19, N-21, N-22} can be selected as the 1-SR node group. Although this case where the number of elements is 8 acquires more 1-SR nodes, compared with the case where G1 (the number of elements is 6) is defined as the 1-SR node group, each of the 1-SR nodes has one SC, having a total of 8 SCs. Generally, the k-SR node to which many SCs are connected has a high possibility that it will be recovered through 1-step iterative decoding. In the AWGN (additive white Gaussian noise) or actual communication environment, if other variable nodes connected to the SC are damaged, they can hardly be recovered. Therefore, it is obvious that the k-SR node having information on the maximal variable nodes for enabling recovering has a high recovering possibility. Therefore, it will be assumed herein that an increase in the number of SCs connected to the k-SR provides the higher quality. That is, it is optionally possible to set the number of k-SR nodes as large as possible regardless of the number of SCs connected according to various puncturing schemes, or to set the number of k-SR nodes such that the number of connected SCs is maximized, for the higher recovering probability. In the illustrated case, 1-SR nodes {N-12, N-14, N-16, N-18, N-20, N-22} are determined so as to provide the high quality, and based on these, 2-SR nodes are determined. In this case, it is preferable to select the high-quality variable nodes {N-13, N-17, N-21} (having the same quality in the embodiment).

As described above, the present invention selects the k-SR nodes having the best quality (selects a k-SR node group with the largest number of SCs among the latent k-SR node groups), and implements puncturing from the k-SR variable node with the lowest k, thereby obtaining a special arithmetic iteration rule for determining groups according to puncturing priority level in the above-described parity structure (a parity structure with a single weight-3 column and a dual-diagram matrix).

FIG. 5 is a diagram illustrating a simple rule for selecting columns mapped to k-SRs (1-SR and 2-SR) with the highest quality from the parity part matrix comprised of a dual-diagonal matrix expressed by a factor graph with a fixed zigzag structure and a column weight-3 outmost column expressed with 1 node getting out of the zigzag structure. As the columns mapped to the 1-SR variable nodes to be first punctured, every second columns G1-1, G1-2, G1-3, G1-4, G1-5, and G1-6 are designated beginning at a weight-3 outmost column N-12, and to puncture the exceeding nodes, every fourth columns G2-1, G2-2, and G2-3 are designated beginning at the next column N-13 of the weight-3 column N-12.

Herein, priorities of the columns having the same puncturing priority are subject to change, and the columns may also be punctured on a sequential basis. In both cases, the weight-3 column must be first punctured.

If the elements belonging to each of the columns are blocks representing z×z unit circulant matrixes and 0 matrixes, it indicates that the columns having the same priority are repeated z times. Therefore, the columns belonging to one block have the same puncturing priority. If a length of bits, to be punctured, of the actually provided packet cannot be divided by the actual column length z of the block, an LDPC code mapped to each column of blocks corresponding to the quotient is fully punctured, and for the remaining bits to be punctured, the LDPC code corresponding thereto can be punctured as many bits as the number of the remaining bits in each of the columns of the next block.

The foregoing arithmetic iteration rule is not only limited to the example shown in FIG. 5, but can also be applied in the same way even to the parity part of the base matrix for all code rates proposed in TGn Sync and to the parity part of the parity check matrix proposed in IEEE 802.16e. That is, the same rule can be applied to the parity part of every parity check matrix having the parity part with the specific structure described above.

Figure 6:
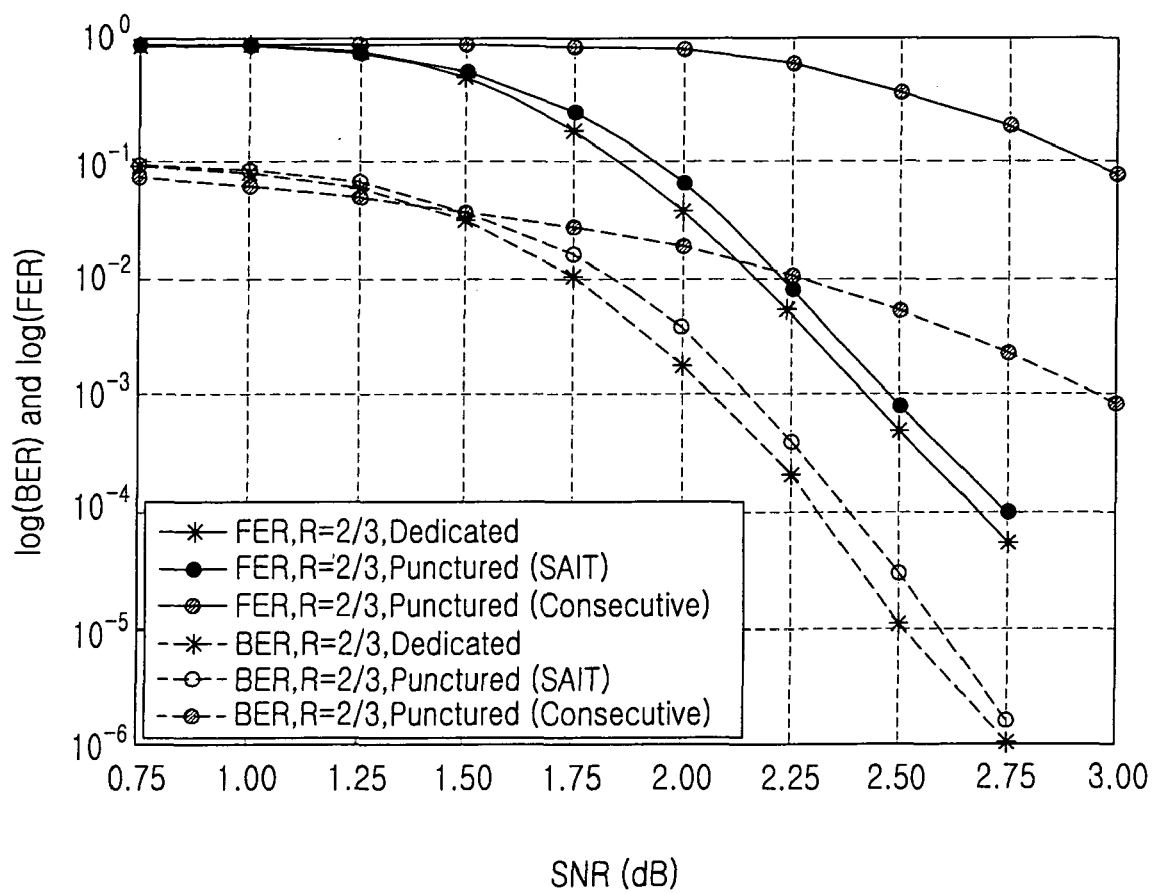
FIG. 6 is a graph illustrating a comparison in performance between puncturing patterns for an LDPC code.

FIG. 6 is a graph illustrating a comparison in performance simulation result between the use of the new puncturing rule and the use of the conventional puncturing pattern. On the assumption that an AWGN channel, a BPSK modulation scheme and the maximum decoding iteration count=50 are used, a comparison in terms of a bit error rate (BER) and a frame error rate (FER) is made between a dedicated code with a block length=1728 and a code rate=⅔, an LDPC code with a code rate=⅔ obtained from an LDPC mother code with a block length=2304 and a code rate=½ by puncturing 576 bits according to the conventional consecutive puncturing pattern, and an LDPC code with a code rate=⅔ obtained from an LDPC mother code with a block length 2304 and a code rate=½ by puncturing 576 bits according to the novel regular puncturing pattern.

As illustrated, it can be noted that the use of the novel puncturing scheme approaches the use of the dedicated code in terms of the performance, whereas the use of the conventional consecutive puncturing pattern causes considerable performance degradation. That is, the puncturing scheme based on the simple rule proposed in the present invention is much superior in performance to the conventional puncturing scheme.

The puncturing scheme based on the novel arithmetic rule not only increases performance, but can rapidly cope with other variables. For example, because the present invention aims at rapidly correctly coping with various puncturing lengths and padding lengths in order to secure flexibility for the frame size, the novel puncturing scheme according to the present invention contrasts (in both object and application result) with the conventional puncturing schemes aimed at finding an optimal puncturing priority set for simply determining a code rate and applying it to a mother code with a low code rate.

Actually, the use of a puncturing pattern optimized for a particular puncturing length may obtain higher performance, compared with the use of the novel puncturing pattern. However, the optimized puncturing pattern means a puncturing pattern obtained by acquiring an optimal puncturing pattern for each of the puncturing lengths according to a particular criterion. That is, in the case where there is a need to determine puncturing priorities appropriate for various puncturing lengths in order to effectively transmit packets with a variable packet length (e.g., a concatenation rule), it is preferable to implement puncturing with the minimum calculation based on the same rule proposed in the present invention and provide performance approaching that possible by the use of the optimal dedicated pattern, instead of using the optimized puncturing pattern for which there is a need to find a new optimal puncturing pattern through complex calculation for every length of the bits to be punctured. Therefore, the novel puncturing scheme having the above characteristics can be called a rate-compatible puncturing scheme.

FIG. 7 is a diagram illustrating a systematic part of the base matrix shown in FIG. 2, wherein a column weight having an irregular but constant rule is shown in the lower part of the corresponding columns. Compared with the conventional technology of sequentially padding from the last column of the systematic part, the present invention determines padding positions so as to secure higher performance.

For the LDPC code, because the way in which padding pattern affects the performance is not defined, the conventional technology sequentially pads by the necessary length from the front part or the rear part, taking only the hardware implementation facility into consideration. However, the present invention experimentally shows that the padding pattern also considerably affects the performance.

Figure 8:
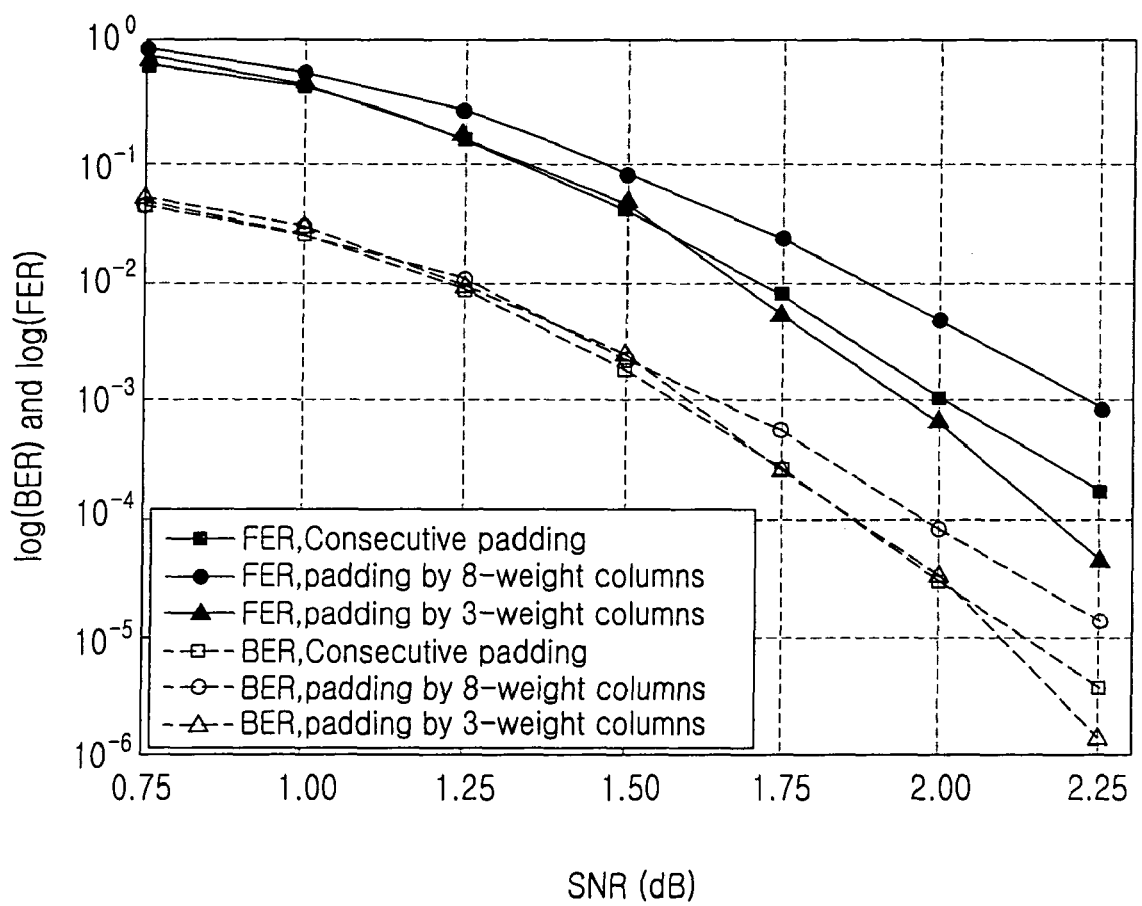
FIG. 8 is a graph illustrating a comparison in performance between padding patterns for an LDPC code.

FIG. 8 is a diagram illustrating a performance difference according to padding pattern when the base matrix shown in FIG. 2 is used. The graph shows BER and FER performances on condition that the maximum decoding iteration count=50, a padding length=216 bits, a puncturing length=168 bits, a packet size=233 bytes, a BPSK modulation scheme, and an AWGN environment are provided. The padding patterns used include the conventional consecutive pattern, the pattern for padding from the columns with the lowest column weight (=3 in the embodiment), and the pattern for padding from the columns with the highest column weight (=8 in the embodiment). As illustrated, it can be noted that the method of padding from the columns with the highest column weight shows the worst performance, the method of padding from the rear part according to the conventional consecutive pattern shows intermediate performance, and the method of padding from the columns with the lowest column weight shows the best performance.

Therefore, when padding a parity check matrix including a systematic matrix with an irregular weight, the present invention pads from the column of the systematic matrix with the lowest column weight. Information on the column weight is fixed, and can be generated in a very simple way according to a column weight configuration rule of the parity check matrix, thereby contributing to performance improvement without an abrupt increase in calculation and delay.

In particular, as for the LDPC matrixes proposed for the high-speed data communication system such as TGn Sync and IEEE 802.16e, the column weight of the systematic part has a relatively simple regularity, so it is possible to select columns with a low column weight using the simple arithmetic calculation.

Table 2 below shows column weight distribution of the systematic part belonging to the base matrixes for individual code rates proposed in TGn Sync, and the novel padding rules according thereto.

TABLE 2

| Code rate | Matrix characteristic | Column weight distribution of systematic part | Padding rule (padding in order of low column weight) |
|---|---|---|---|
| 1/2 | Irregular | {8, 3, 3, 8, 3, 3, 8, 3, 3, 8, 3, 3} | Padding in order of a column with a column weight 3 by MOD(3) |
| 2/3 | Irregular | {3, 3, 3, 3, 3, 3, 3, 3, 4, 4, 4, 4, 4, 4} | Sequentially padding from first column |
| 3/4 | Irregular | {6, 6, 6, 6, 6, 6, 3, 3, 3, 3, 3, 3, 3, 3, 3, 3} | Sequentially padding from last column |
| 5/6 | Regular | Uniform to 4 | Random padding |
| 7/8 | Regular | Uniform to 3 | Random padding |

As illustrated in Table 2, because a column weight of the irregular systematic matrix has a specific regularity, it is possible to realize a padding order for each individual code rate according to the simple padding calculation scheme even though there is no detailed information on the column weight of the matrix. Because this can differ according to the applied parity check matrix, it is possible to configure a system such that it newly obtains a detailed padding rule according to the applied system and applies the padding rule to the system, or simply pads from the columns with the lowest column weight.

Even for the padding, when the used parity check matrix is a base matrix expressed with blocks representing z×z unit circulant matrixes and 0 matrixes as elements, columns belonging to one block are equal to each other in padding priority. If a length of bits, to be padded, of the actually provided packet cannot be divided by the actual column length z of the block, the remaining padding bits are mapped to some columns of the next block added to the block corresponding to the quotient.

Therefore, the use of the foregoing new puncturing pattern and padding pattern can determine regular puncturing priorities and padding priorities only with very simple calculation in the process of coding variable-length packets such that they have low overhead and performance degradation, contributing to a satisfactory increase in the performance. In particular, because this puncturing scheme, when using the parity check matrixes having a specific structure, has a constant rule regardless of a change in the code rate or a change in the applied parity check matrix, the puncturing scheme has a rate-compatibility characteristic, causing an improvement in flexibility and efficiency of the frame size.

Figure 9:
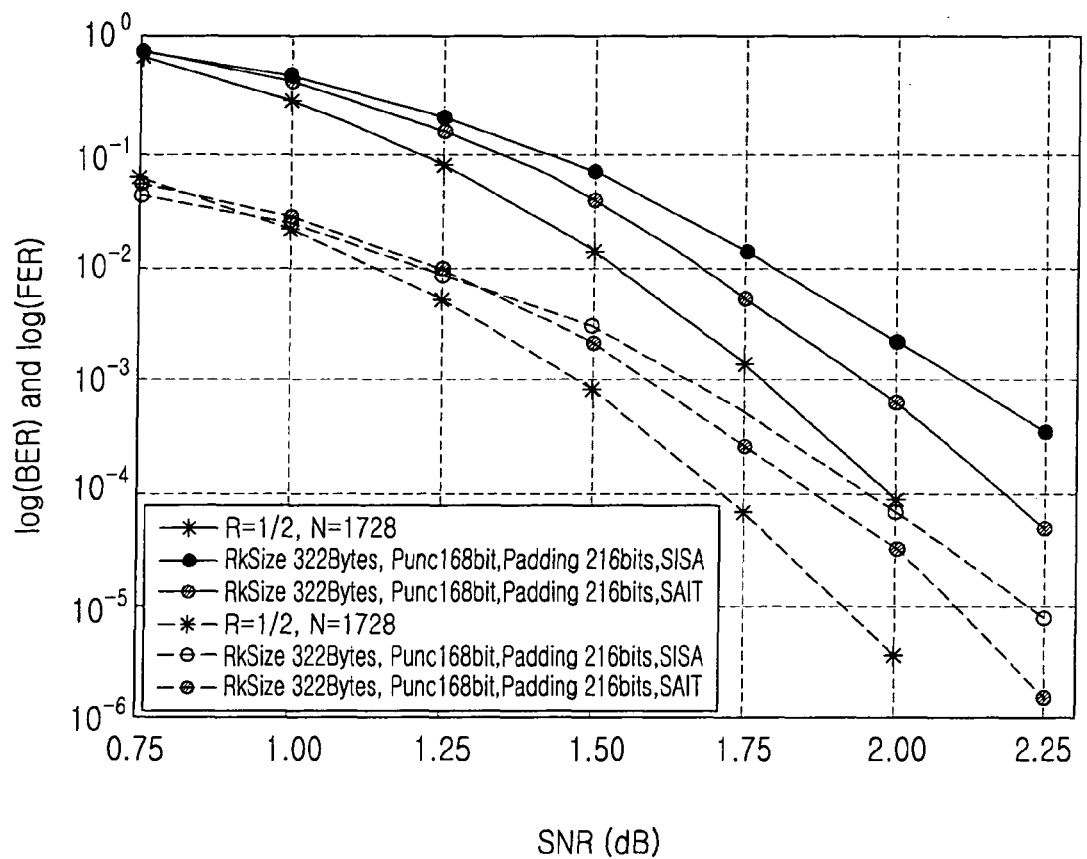
FIG. 9 is a graph illustrating a comparison in performance between padding and puncturing patterns for an LDPC code

FIG. 9 is a diagram illustrating performances in the process of transmitting a 1728-bit codeword and a 322-byte packet at a code rate ½ using the puncturing rule and the padding rule according to an embodiment of the present invention. Herein, a comparison is made between the result of using the conventional consecutive pattern (denoted by SISA), the result of using the novel pattern (denoted by SAIT), and the reference optimal performance.

As illustrated, it can be noted that the present invention is superior to the prior art even in terms of the BER performance. Further, it can be proved that the present invention is much superior to the prior art in terms of FER, which is a criterion for determining the performance.

As can be understood from the foregoing description, the LDPC code puncturing and padding method according to the present invention can obtain high performance approaching the optimal performance by merely puncturing the LDPC code using the simple arithmetic rule because for the parity check matrix having a parity part structure comprised of columns with a column weight 3 and dual-diagonal matrixes, elements of each k-SR node group with the highest quality have regular positions. In addition, for the systematic part with an irregular column weight, the LDPC code is subject to padding from the bit mapped to the column with the lowest column weight, contributing to remarkable performance improvement. The use of the foregoing puncturing and padding scheme can realize flexibility of the frame size for effectively transmitting a variable-length packet with simple calculation, thereby reducing the realization load and decoding delay time and obtaining high performance approaching the optimal performance. In particular, for the parity part structure comprised of columns with a column weight 3 and dual-diagonal matrixes, the use of the proposed puncturing pattern shows the optimal performance for all code rates, so the proposed puncturing pattern can be applied even to the H-ARQ technology based on Incremental Redundancy (IR) scheme.

While the invention has been shown and described with reference to a certain preferred embodiment thereof, it will be understood by those skilled in the art that various changes in form and detail may be made therein without departing from the spirit and scope of the invention as defined by the appended claims.

What is claimed is:

1. A method for puncturing, by a transmitter, a Low Density Parity Check (LDPC) code that is expressed by a factor graph having a check node and a variable node, connected to each other by an edge, and is decoded by a base matrix including a parity part having of a single weight-3 column and a dual-diagonal matrix, the method comprising:
   determining, by the transmitter, priorities of variable nodes including a variable node of the LDPC code mapped to the single weight-3 column according to an arithmetic rule, the arithmetic rule comprising sequentially determining a k-Step Recoverable (k-SR) variable node group with a largest number of Survived Check nodes (SCs) among latent k-SR node groups; and
   puncturing, by the transmitter, the LDPC code mapped to each of the variable nodes according to the priorities,
   wherein k is a step decoding number.

2. The method of claim 1, wherein the base matrix comprises a matrix obtained by dividing a parity check matrix for decoding an LDPC code into shifted unit circulant matrix and zero matrix blocks with a predetermined size, and representing each of the blocks as an element thereof.

3. The method of claim 2, wherein, if one of the variable nodes is mapped to one block and there is a remainder after bits of an LDPC code to be punctured are divided by size of the block, bits corresponding to the remainder are punctured according to each column of a matrix constituting a block mapped to a variable node having a low priority among the variable nodes.

4. The method of claim 1, wherein the step of determining priorities of variable nodes includes:
   selecting 1-Step Recoverable (1-SR) variable nodes having the largest number of SCs among the latent k-SR node groups including a variable node mapped to the single weight-3 column among the variable nodes, and determining a variable node group to be first punctured using the selected 1-SR variable nodes; and
   selecting k-Step Recoverable (k-SR) variable nodes having the largest number of SCs among the latent k-SR node groups in a next step k taking into account the 1-SR variable nodes; and
   determining a variable node group to be punctured next using the selected k-SR variable nodes.

5. The method of claim 4, wherein the 1-SR variable nodes are connected to any survived check nodes that are connectable to the 1-SR variable nodes.

6. The method of claim 1, wherein the step of sequentially puncturing an LDPC code mapped to each of the variable nodes includes:
   (a) first puncturing the LDPC code mapped to the single weight-3 column;
   (b) second puncturing LDPC codes mapped to variable nodes selected according to a first arithmetic rule;
   (c) third puncturing LDPC codes mapped to variable nodes selected according to at least one arithmetic rule other than the first arithmetic rule; and
   (d) repeating steps (a), (b), and (c) at least once.

7. The method of claim 1, wherein the arithmetic rule is applied to each dedicated base matrix independently prepared for individual code rates.

8. The method of claim 1, wherein the arithmetic rule further comprises a rule for selecting and first puncturing the LDPC code mapped to the single weight-3 column, selecting and second puncturing an LDPC code mapped to every second column beginning at the single weight-3 column, and selecting and third puncturing an LDPC code mapped to every fourth column beginning at the next column of the single weight-3 column.

9. A method for puncturing, by a transmitter, a Low Density Parity Check (LDPC) code that is expressed by a factor graph having a check node and a variable node, connected to each other by an edge, and is decoded by a parity check matrix including a parity part having a single weight-3 column and a dual-diagonal matrix, the method comprising:
  selecting, by the transmitter, 1-Step Recoverable (1-SR) variable nodes with a largest number of Survived Check nodes (SCs) among latent k-SR node groups including a variable node of the LDPC code mapped to the single weight-3 column, and setting a first puncturing priority group using the selected 1-SR variable nodes;
  selecting, by the transmitter, k-step recoverable (k-SR) variable nodes with the largest number of SCs among the latent k-SR node groups in the next step k taking into account the 1-SR variable nodes, and setting a $k^{th}$ puncturing priority group; and
  sequentially puncturing, by the transmitter, the LDPC code mapped to each of variable nodes included in a corresponding group according to a priority of each of the first puncturing priority group and the $k^{th}$ puncturing priority group,
  wherein k is a decoding step number.

10. The method of claim 9, wherein the 1-SR variable nodes are connected to any survived check nodes that are connectable to the 1-SR variable nodes.

11. The method of claim 9, wherein the priorities of the first puncturing priority group and the $k^{th}$ puncturing priority group is determined according to a arithmetic rule for determining a puncturing priority.

12. The method of claim 9, wherein the arithmetic rule is applied to each dedicated parity check matrixes independently prepared for individual code rates.

13. A method for padding and puncturing, by a transmitter, a Low Density Parity Check (LDPC) code that is expressed by a factor graph a check node and a variable node, connected to each other by an edge, and is decoded by a base matrix having a parity part having a single weight-3 column and a dual-diagonal matrix, and a systematic part including matrixes with known different two column weights, the method comprising:
  performing, by the transmitter, padding on the LDPC code mapped to a corresponding column in order of a low column weight among columns of the systematic part; and
  performing, by the transmitter, puncturing on the LDPC code mapped to columns of the parity part independently obtained for each individual puncturing priority level according to an arithmetic iterative selection rule for determining a puncturing priority, the arithmetic iterative selection rule comprising sequentially determining a k-Step Recoverable (k-SR) variable node group with a largest number of Survived Check nodes (SCs) among latent k-SR node groups,
  wherein k is a decoding step number.

14. The method of claim 4, wherein the k-SR variable nodes comprise variable nodes such that any survived check nodes that are connectable to the k-SR variable nodes are connected.

15. The method of claim 10, wherein the k-SR variable nodes comprise variable nodes such that any survived check nodes that are connectable to the k-SR variable nodes are connected.

* * * * *